(12) United States Patent
Liu

(10) Patent No.: US 7,710,740 B2
(45) Date of Patent: May 4, 2010

(54) ASSEMBLY STRUCTURE OF FLEXIBLE BOARD AND RIGID BOARD

(75) Inventor: Chien-Liang Liu, Taipei Hsien (TW)

(73) Assignee: Cheng Uei Precision Industry Co., Ltd., Taipei Hsien (TW)

( * ) Notice: Subject to any disclaimer, the term of this patent is extended or adjusted under 35 U.S.C. 154(b) by 423 days.

(21) Appl. No.: 11/875,886

(22) Filed: Oct. 20, 2007

(65) Prior Publication Data

US 2009/0103275 A1    Apr. 23, 2009

(51) Int. Cl.
*H05K 1/11* (2006.01)

(52) U.S. Cl. .................... 361/784; 439/77; 439/79; 439/67; 361/748; 361/749; 361/792

(58) Field of Classification Search ............. 361/748, 361/749, 756, 741, 802, 758, 742, 770, 804, 361/759, 784, 789, 776, 792; 174/535, 541, 174/542, 545, 559, 560, 260–266, 363–375, 174/561, 372, 562, 657, 563, 659, 650, 661, 174/663, 665, 668, 669; 439/67, 69, 73, 439/74, 77, 78, 79, 80–84, 492–499
See application file for complete search history.

(56) References Cited

U.S. PATENT DOCUMENTS

| | | | | |
|---|---|---|---|---|
| 5,044,980 A | * | 9/1991 | Krumme et al. | 439/496 |
| 5,920,465 A | * | 7/1999 | Tanaka | 361/784 |
| 6,062,911 A | * | 5/2000 | Davis et al. | 439/630 |
| 6,146,184 A | * | 11/2000 | Wilson et al. | 439/374 |
| 6,733,319 B1 | * | 5/2004 | Jørgensen | 439/329 |
| 2002/0081873 A1 | * | 6/2002 | Harris et al. | 439/79 |
| 2008/0233793 A1 | * | 9/2008 | Ju | 439/493 |

* cited by examiner

*Primary Examiner*—Dameon E Levi
*Assistant Examiner*—Hoa C Nguyen
(74) *Attorney, Agent, or Firm*—WPAT, P.C.; Anthony King

(57) ABSTRACT

An assembly structure of flexible board and rigid board includes a rigid board, a sub-board and a flexible board. The rigid board defines a locking gap having two side surfaces projecting toward each other to form two resisting portions. The sub-board has a standing portion inserted in the locking gap. Bilateral sides of the standing portion extend outward to form two preventing arms against a bottom surface of the rigid board. The flexible board has a base portion inserted in the locking gap of the rigid board. The base portion has a front surface and a back surface located to a front surface of the sub-board. The front surface of the base portion is against the resisting portions.

8 Claims, 4 Drawing Sheets

US 7,710,740 B2

ASSEMBLY STRUCTURE OF FLEXIBLE BOARD AND RIGID BOARD

BACKGROUND OF THE INVENTION

1. Field of the Invention

The present invention relates to an assembly structure of flexible board and rigid board, and more particularly to an integration structure by FPC (flexible printed circuit) and PCB (printed circuit board) to firmly accommodate an electronic element, such as a push button.

2. The Related Art

As well known that a FPC has many properties that differ from a PCB, wherein the main difference is that the FPC is of flexibility, and so the FPC is foldable and disposed at will according to a space defined in a product. Therefore, the FPC is widely used in varieties of fields like an electronic product field, a vehicle field and so on, although the FPC is more expensive than the PCB. In recent years the FPC has been made lighter and thinner accompanying the trend toward lighter and thinner electronic products, such as digital cameras, mobile phones, and notebook computers.

Conventionally, the FPC is attached to the PCB through a method of SMT (surface mounted technology) or via a connector. Sometimes, the FPC is glued with the PCB though the method of SMT. Even so, the FPC is not attached to the PCB tightly, which influences the electrical transmission between the FPC and the PCB. Further more, the FPC conventionally connects with electronic equipment, that is, after finishing assembling the FPC and the PCB, particular tools for assembling shall be taken away, and then, the electronic equipment is mounted on the FPC. Therefore, the working processes are complex, reducing work efficiency.

SUMMARY OF THE INVENTION

Accordingly, an object of the present invention is to provide an assembly structure of flexible board and rigid board including a rigid board, a sub-board and a flexible board. The rigid board defines a locking gap having two side surfaces respectively projecting toward each other to form two resisting portions. The sub-board has a standing portion inserted in the locking gap of the rigid board. Bilateral sides of the standing portion extend outward to form two preventing arms against a bottom surface of the rigid board. The flexible board has a base portion inserted in the locking gap of the rigid board. The base portion has a front surface and a back surface located to a front surface of the sub-board. The front surface of the base portion is against the two resisting portions of the rigid board for locating the flexible board and the sub-board in the locking gap.

As described above, the present invention utilizes the sub-board to increase the hardness of the flexible board, and therefore, the flexible board is fixedly assembled with the rigid board without using other tools. The design simplifies the assembly processes and advances the work efficiency.

BRIEF DESCRIPTION OF THE DRAWINGS

The present invention will be apparent to those skilled in the art by reading the following description of a preferred embodiment thereof, with reference to the attached drawings, in which.

DETAILED DESCRIPTION OF THE PREFERRED EMBODIMENT

Figure 1:
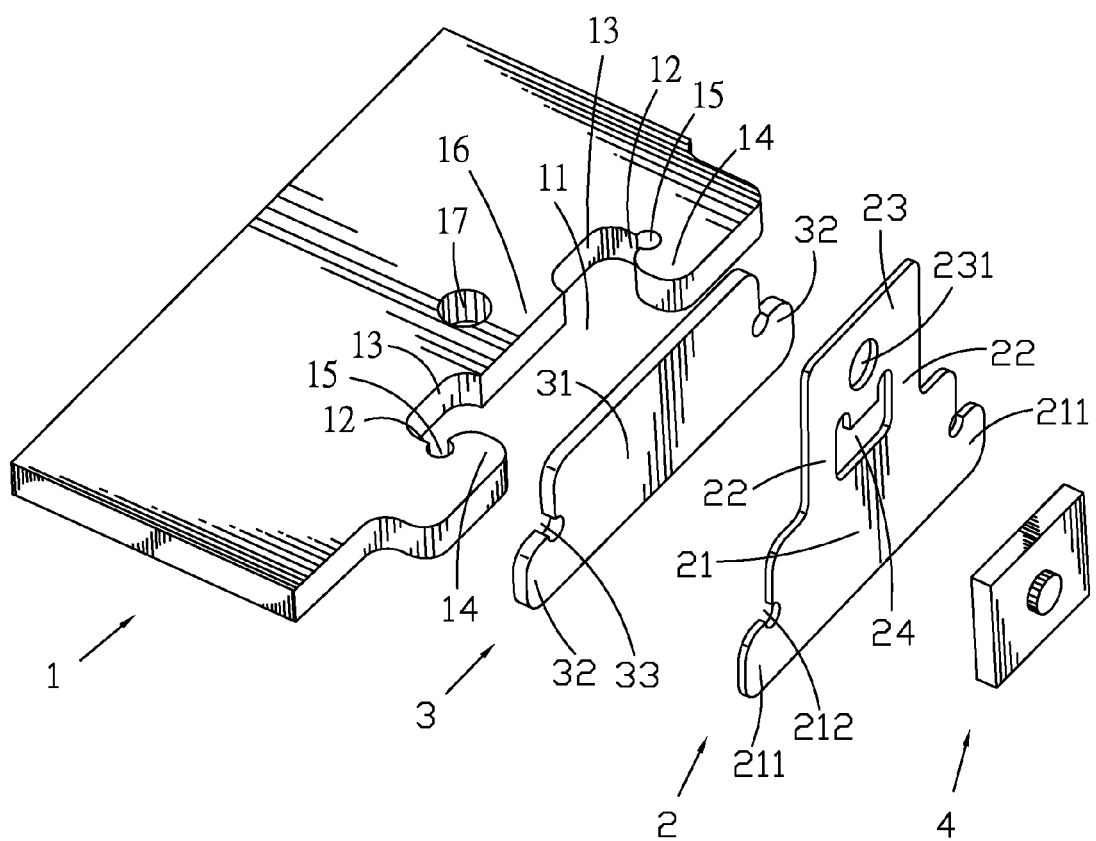
FIG. 1 is an exploded view of an assembly structure of FPC and PCB of the present invention.

Referring to FIG. 1, in a preferred embodiment of the present invention, an assembly structure of flexible board and rigid board 100 includes a PCB (printed circuit board) 1, a FPC (flexible printed circuit) 2, a sub-board 3 and an electronic element 4.

The PCB 1 is a substantially rectangular plane board and disposed longitudinally. The PCB 1 has a top surface and a bottom surface (not labeled). A front edge side of the PCB 1 defines a locking gap 11 thereon passing through the top surface and the bottom surface. The locking gap 11 extends transversely toward the inner of the PCB 1 and stretches longitudinally toward two ends of the PCB 1. The locking gap 11 defines two side surfaces 12 which are opposite to each other at both ends thereof. The locking gap 11 defines an inner surface 13 at an inner edge thereof for connecting with the two side surfaces 12. Junctions of the inner surface 13 and the two side surfaces 12 are smooth arcs. The center of the inner surface 13 protrudes frontward to form a first resisting portion 16. The side surfaces 12 respectively project toward each other to form two second resisting portions 14 in front of the first resisting portion 16. A corner of the side surface 12 and the second resisting portion 14 defines a first open sub-hole 15 for simply assembling the PCB 1 and the FPC 2. A first locating hole 17 is defined on the PCB 1 at the rear of the first resisting portion 16 and adjacent to the first resisting portion 16.

The FPC 2 is a sheet of board and has a base portion 21 disposed longitudinally. Bilateral sides of the base portion 21 extend outward to form two first preventing arms 211 at bottom. The corner of the first preventing arm 211 and the base portion 21 defines a second open sub-hole 212 for easily assembling the PCB 1 and the FPC 2. A top surface of the base portion 21 protrudes upward and defines two connecting portions 22 parallel with each other. The two connecting portions 22 connect with a square soldering portion 23. The center of the square soldering portion 23 defines a second locating hole 231 passing therethrough. The diameter of the second locating hole 231 is substantially the same as the diameter of the first locating hole 17. A square art hole 24 is defined between the two connecting portions 22. The middle of a top surface of the art hole 24 protrudes downward a bit.

The sub-board 3 is attached to the FPC 2 for increasing the hardness of the FPC 2. The sub-board 3 is of inflexible material and fittingly mates with the base portion 21 of the FPC 2. The sub-board 3 has a standing portion 31 disposed longitudinally. Bilateral sides of the standing portion 31 extend outward to form two second preventing arms 32 at bottom. The corner of the second preventing arm 32 and the standing portion 31 defines a third open sub-hole 33 having the same function as the first and second sub-holes 15, 212.

As described above, it can be seen that the sub-board 3 has the same structure as the base portion 21 of the FPC 2. Therefore, two ways of the sub-board 3 attached to the base portion 21 of the FPC 2 are provided. One way is to attach the sub-board 3 on the base portion 21, and then cut the sub-board 3 and the FPC 2 at the same time by pressing. The other way is to shape the sub-board 3 and the FPC 2 respectively, and then attach the sub-board 3 on the base portion 21 of the FPC 2.

Figure 2:
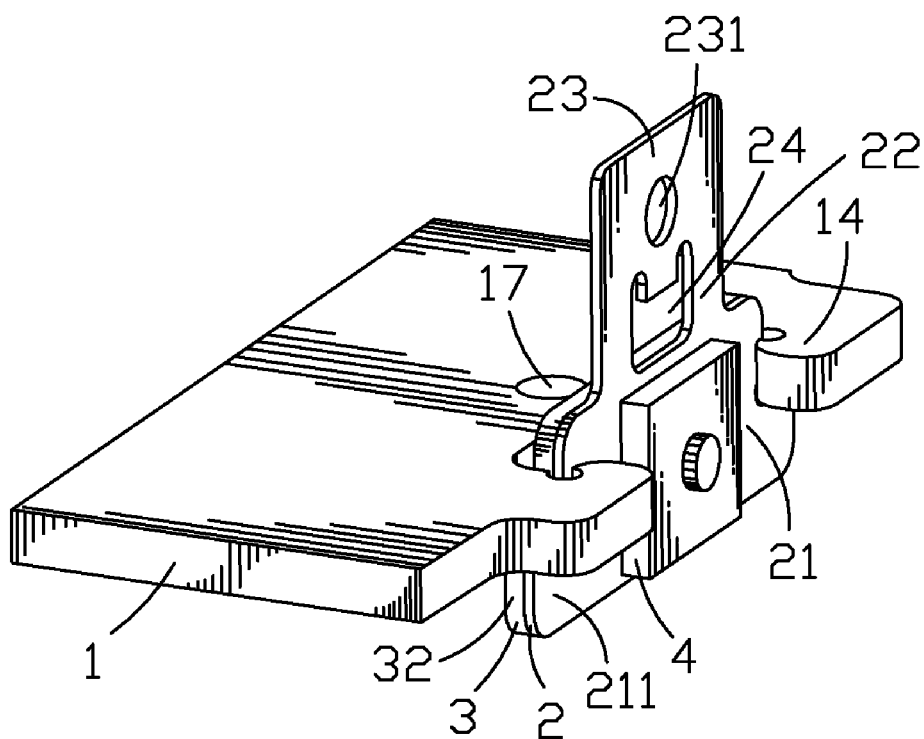
FIG. 2 is a perspective view showing a FPC inserted in a PCB and assembled with an electronic element.
Figure 3:
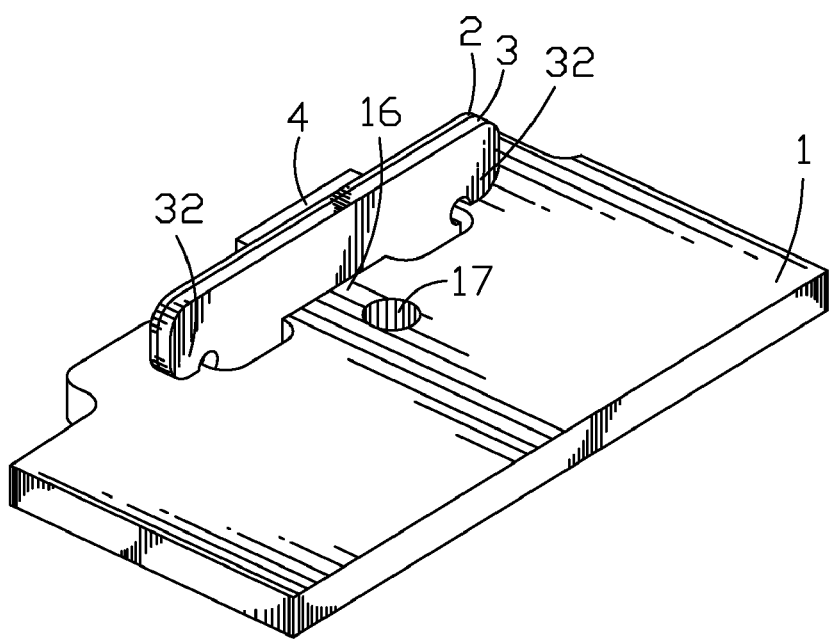
FIG. 3 is another perspective view of FIG. 2.

Please refer to FIG. 2 and FIG. 3. Surfaces of the PCB 1 and the FPC 2 are arranged a plurality of soldering spots (not shown) for constituting electric circuits. The electronic element 4 is stuck to the soldering spots of a front surface of the base portion 21 of the FPC 2 through a method of SMT (surface mounted technology). A front surface of the sub-board 3 is attached to a back surface of the base portion 21. The FPC 2 assembled with the sub-board 3 and the electronic element 4 is inserted in the locking gap 11 of the PCB 1 from down and up. The first preventing arms 211 of the FPC 2 and the second preventing arms 32 of the sub-board 3 are against the bottom surface of the PCB 1. The first resisting portion 16 resists a back surface of the standing portion 31 of the sub-board 3, and the second resisting portions 14 resist the front surface of the base portion 21 of the FPC 2. That is, the FPC 2 and the sub-board 3 are located between the first resisting portion 16 and the second resisting portions 14. In the preferred embodiment of the present invention, the electronic element 4 is a push button. On one hand, the sub-board 3 is attached to the back surface of base portion 21, facilitating the FPC 2 to be located, and on the other hand, the sub-board 3 provides a supporting force to the push button, facilitating the push button to be pressed.

Figure 4:
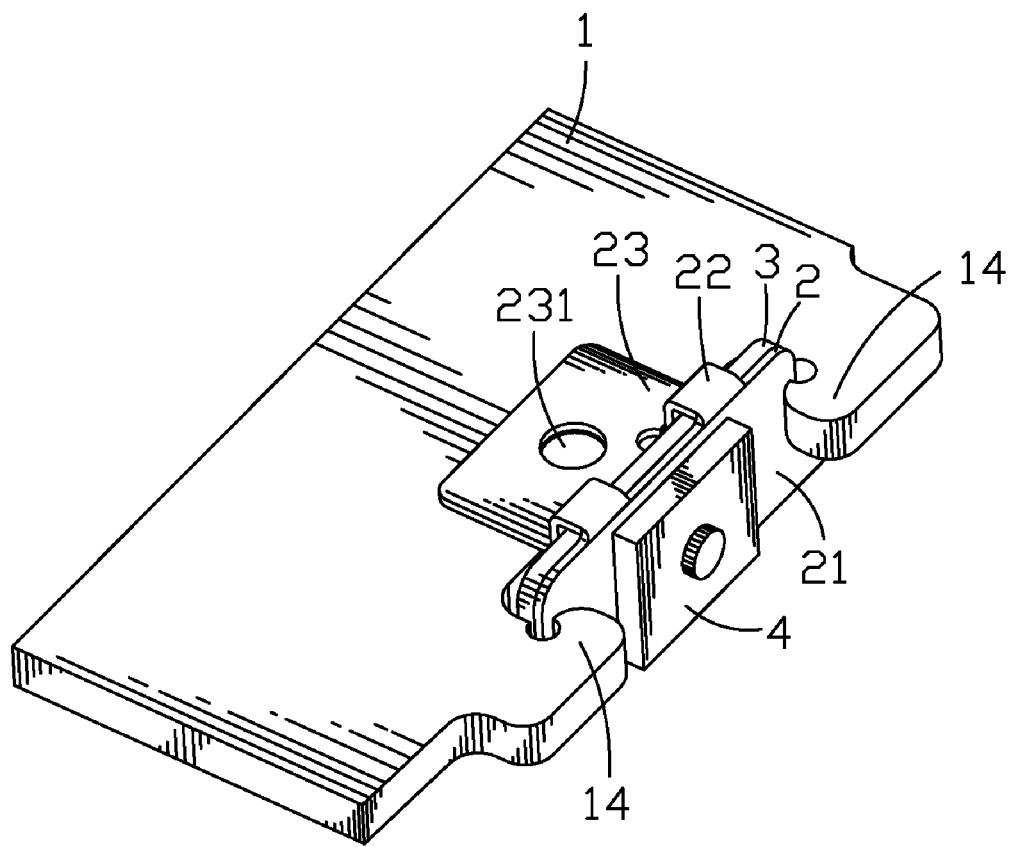
FIG. 4 is a perspective view showing a soldering portion of the FPC attached to the PCB.

With reference to FIG. 4, the FPC 2 is pulled upward tightly. The two connecting portions 22 of the FPC 2 are bent backward along a top surface of the standing portion 31 of the sub-board 3. Then the two connecting portions 22 are bent downward along the back surface of the standing portion 31 and stay close to the back surface of the standing portion 31. The square soldering portion 23 is bent vertically relative to the two connecting portions 22 and is attached to the top surface of the PCB 1. A locating pin (not shown) is inserted in the second locating hole 231 and the first locating hole 17 in turn from up and down for tightly pulling the FPC 2 and fastening the square soldering portion 23 on the top surface of the PCB 1.

The soldering spots of the square soldering portion 23 of the FPC 2 are electrically connected with the electronic element 4 through electric circuits disposed in the FPC 2. After the square soldering portion 23 is attached to the top surface of the PCB 1, the soldering spots of the square soldering portion 23 are located on the soldering spots of the top surface of the PCB 1 through the method of SMT. Therefore, the PCB 1 electrically connects with the electronic element 4. Then, the locating pin is removed out of the second locating hole 231 and the first locating hole 17. Because the first preventing arms 211 of the FPC 2 and the second preventing arms 32 of the sub-board 3 are against the bottom surface of the PCB 1 and the square soldering portion 23 of the FPC 2 is located on the top surface of the PCB 1, the FPC 2 is fixedly assembled with the PCB 1 without using other tools.

As described above, the present invention utilizes the sub-board 3 to increase the hardness of the FPC 2, and therefore, the FPC 2 is fixedly assembled with the PCB 1 without using other tools. The design simplifies the assembly processes and advances the work efficiency.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. An assembly structure of flexible board and rigid board, comprising:
   a rigid board, defining a locking gap having two side surfaces, the two side surfaces respectively projecting toward each other to form two resisting portions;
   a sub-board, having a standing portion inserted in the locking gap of the rigid board, bilateral sides of the standing portion extending outward to form two preventing arms against a bottom surface of the rigid board; and
   a flexible board, having a base portion inserted in the locking gap of the rigid board, the base portion having a front surface and a back surface located to a front surface of the sub-board, the front surface of the base portion against the two resisting portions of the rigid board for locating the rigid board and the sub-board in the locking gap.

2. The assembly structure of flexible board and rigid board as claimed in claim 1, wherein the locking gap defines an inner surface at an inner edge thereof for connecting with the two side surfaces, junctions of the inner surface and the two side surfaces are smooth arcs.

3. The assembly structure of flexible board and rigid board as claimed in claim 2, wherein the inner surface protrudes frontward to form a second resisting portion at center, the second resisting portion resists a back surface of the sub-board.

4. The assembly structure of flexible board and rigid board as claimed in claim 1, wherein the base portion of the flexible board extends outward from bilateral sides thereof to form two second preventing arms at bottom, the two second preventing arms are attached to the preventing arms of the sub-board respectively and are against the bottom surface of the rigid board.

5. The assembly structure of flexible board and rigid board as claimed in claim 1, wherein the base portion of the flexible board connects with a soldering portion located on a top surface of the rigid board.

6. The assembly structure of flexible board and rigid board as claimed in claim 5, wherein the base portion of the flexible board protrudes upward from a top surface thereof and defines two connecting portions parallel with each other, the two connecting portions connect with the soldering portion.

7. The assembly structure of flexible board and rigid board as claimed in claim 5, wherein the rigid board defines a first locating hole at the rear of the locking gap and adjacent to the locking gap, the soldering portion defines a second locating hole mating with the first locating hole of the rigid board.

8. The assembly structure of flexible board and rigid board as claimed in claim 7, wherein the first locating hole defined on the rigid board and the second locating hole defined on the soldering portion of the flexible board have the same diameter and the same axle center.

* * * * *